(12) United States Patent
Mischitz et al.

(10) Patent No.: US 9,190,322 B2
(45) Date of Patent: Nov. 17, 2015

(54) METHOD FOR PRODUCING A COPPER LAYER ON A SEMICONDUCTOR BODY USING A PRINTING PROCESS

(71) Applicant: Infineon Technologies AG, Neubiberg (DE)

(72) Inventors: Martin Mischitz, Wernberg (AT); Manfred Schneegans, Vaterstetten (DE); Markus Heinrici, Vikring (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/163,694

(22) Filed: Jan. 24, 2014

(65) Prior Publication Data

US 2015/0214095 A1  Jul. 30, 2015

(51) Int. Cl.
*H01L 21/44* (2006.01)
*H01L 21/768* (2006.01)
*H01L 23/00* (2006.01)
*H01L 21/027* (2006.01)
*H01L 23/532* (2006.01)

(52) U.S. Cl.
CPC ........ *H01L 21/7688* (2013.01); *H01L 21/0272* (2013.01); *H01L 21/76883* (2013.01); *H01L 23/53228* (2013.01); *H01L 23/562* (2013.01)

(58) Field of Classification Search
USPC .......................................... 438/660, 658, 663
See application file for complete search history.

(56) References Cited

U.S. PATENT DOCUMENTS

| | | | |
|---|---|---|---|
| 4,388,346 A | 6/1983 | Bickler | |
| 4,830,878 A * | 5/1989 | Kaneko et al. | 427/97.4 |
| 5,411,601 A * | 5/1995 | Higuchi et al. | 136/256 |
| 8,338,317 B2 | 12/2012 | Engelhardt et al. | |
| 2004/0051085 A1 * | 3/2004 | Moriya | 252/512 |
| 2007/0051927 A1 * | 3/2007 | Itoh et al. | 252/500 |
| 2009/0139608 A1 * | 6/2009 | Tanaka et al. | 148/24 |
| 2010/0055302 A1 * | 3/2010 | Kim et al. | 427/98.4 |
| 2010/0300526 A1 * | 12/2010 | Denda et al. | 136/256 |
| 2012/0154346 A1 * | 6/2012 | Hirose | 345/204 |
| 2012/0163011 A1 * | 6/2012 | Fujimura | 362/551 |
| 2012/0175147 A1 | 7/2012 | Nakako et al. | |
| 2012/0187408 A1 * | 7/2012 | Tanaka et al. | 257/64 |
| 2012/0240971 A1 * | 9/2012 | Telle et al. | 136/244 |
| 2013/0206225 A1 | 8/2013 | Zinn et al. | |
| 2014/0023779 A1 * | 1/2014 | Oh et al. | 427/126.1 |
| 2014/0220239 A1 * | 8/2014 | Labranche | 427/126.3 |

FOREIGN PATENT DOCUMENTS

JP  2010053377 A  3/2010

OTHER PUBLICATIONS

Halonen, E., et al., "The Effect of Laser Sintering Process Parameters on Cu Nanoparticle Ink in Room Conditions," Optics and Photonics Journal, Aug. 2013, pp. 40-44, vol. 3, Scientific Research.

"Copper coating onto silicon semiconductor wafers," reinhausen plasma, downloaded on Apr. 21, 2014, pp. 1-2, http://www.reinhausen-plasma.com/en/desktopdefault.aspx/tabid-1669/2230_read-5837/.

* cited by examiner

*Primary Examiner* — Karen Kusumakar
(74) *Attorney, Agent, or Firm* — Slater & Matsil, L.L.P.

(57) ABSTRACT

A method for producing a metal layer on a wafer is described. In one embodiment the method comprises providing a semiconductor wafer including a coating, printing a metal particle paste on the semiconductor wafer thereby forming a metal layer and heating the metal layer in a reductive gas for sintering the metal particle paste or for annealing a sintered metal particle paste in an oven.

19 Claims, 4 Drawing Sheets

US 9,190,322 B2

METHOD FOR PRODUCING A COPPER LAYER ON A SEMICONDUCTOR BODY USING A PRINTING PROCESS

TECHNICAL FIELD

Embodiments of the present invention relate to a method for processing a semiconductor wafer or a die, particularly to a method for the fabrication of copper layers on a semiconductor body.

BACKGROUND

In the fabrication of semiconductor chips, processing typically includes the deposition of a particle layer on existing layers. This may include deposition of metallization layers for interconnection or bonding, wherein copper is increasingly used as a replacement for aluminum due to its low electrical resistance and high thermal conductivity. Such metallization layers may be produced using a particle deposition process. However, due to the significantly different coefficients of thermal expansion (CTE) of copper and silicon, high mechanical stress may occur when temperature changes. Delamination of the copper layer and crack formation may be the consequences. Deposition of porous copper layers may alleviate the above-mentioned problem of thermal mechanical stress. However, the plasma or electro-chemical processes currently used for deposition of porous copper layers are comparably complex and expensive.

There is therefore a need for an improved method for processing semiconductor wafers or dies, particularly for producing porous copper layers, which form electrical interconnects on the semiconductor wafer or die.

SUMMARY OF THE INVENTION

A method for processing a wafer is described. In accordance with one example of the invention the method comprises providing a semiconductor wafer including a coating and printing a metal particle paste on the semiconductor wafer to form a porous or non-porous metal layer. A heat treatment is performed within an atmosphere which includes a reductive gas for sintering the metal particle paste or for annealing the sintered metal particle paste.

Furthermore, a method for producing a metal layer on a substrate is described. In accordance with another example of the invention the method comprises providing a substrate and printing a metal particle paste on the substrate to form a porous or non-porous metal layer. A heat treatment is performed within an atmosphere which includes a reductive gas for sintering the metal particle paste or for annealing the sintered metal particle paste.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

Figure 1:
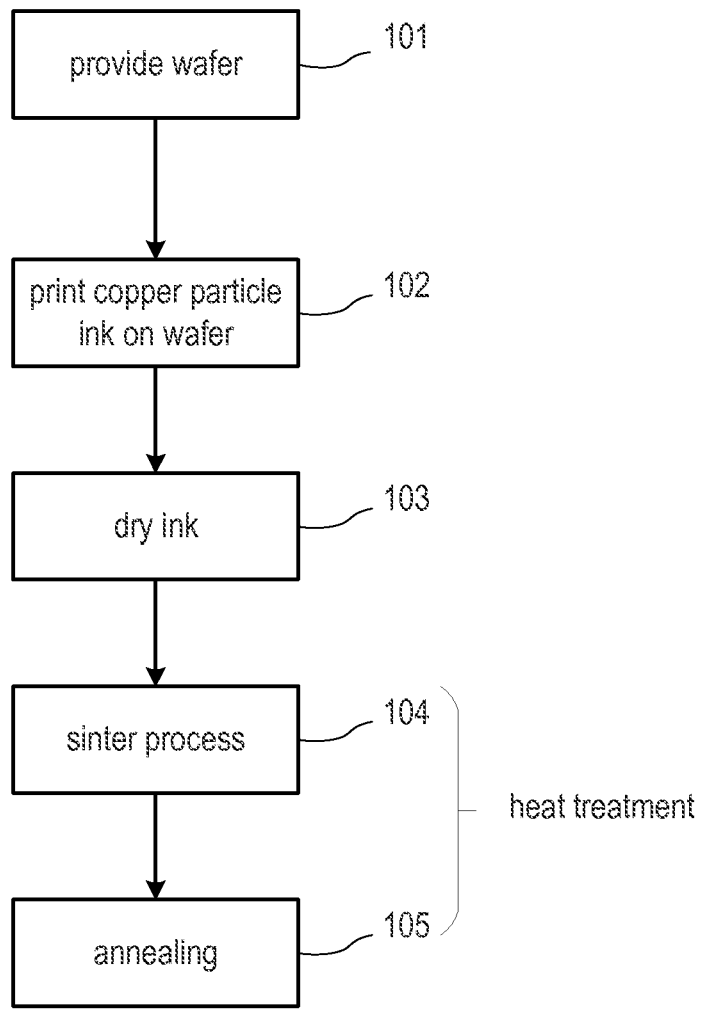
FIG. 1 is a flow chart illustrating an exemplary process for processing a wafer to produce a thick copper layer.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Copper (Cu) was introduced several years ago to replace aluminum (Al) interconnections in ultra-large scale integration (ULSI) logic devices in order to produce small dimension, higher speed devices. The electrical resistivity of copper is $1.7 \cdot 10^{-6}$ $\Omega \cdot cm$ as compared to $3 \cdot 10^{-6}$ $\Omega \cdot cm$ for aluminum. The high electrical and thermal conductivity of copper are very attractive for applications for ULSI logic devices as well as for smart power devices. The high electrical conductivity of copper allows high current flow per unit area with less heat generation. High thermal conductivity also helps to efficiently dissipate the heat generated by current flow during device operation.

Due to significantly different coefficients of thermal expansion (CTE) of copper and silicon (Si) thermally induced mechanic stress (thermal stress) may occur within the wafer of the silicon die and delamination or crack formation may be a result. This problem may be alleviated by limiting the thickness of the copper layer to about 10 µm or by forming porous copper layers, which result in significantly lower thermal stress due to their porosity. Such porous copper coatings may be applied to silicon wafers for electrical contacting purposes and to dissipate heat away from semiconductor elements. Depositions processes used to deposit particles from plasma to form a copper layer, e.g., the so-called plasmadust® process, are used to reproducibly deposit copper layers with a specific layer thickness, selectable porosity, and specific resistance values. However, such plasma deposition processes are comparably complex and expensive.

In accordance with the embodiment described herein, a printing process is used to form a comparably thick (e.g., up to approximately 100 µm) metal layer on a silicon wafer or die, particularly a copper layer or a nickel layer. In the past, a considerable amount of research has been conducted to develop methods for printing electrically conductive structures. This includes not only the printing technologies but also material development and post processing methods. For example, inkjet printing processes have been used to print electrically conductive ink to form electrically conductive structures on cheap substrates like paper, plastic foils (e.g., polyimide), textile sheets or the like. A common conductive ink includes metal (e.g., silver, gold, nickel, copper or alloys of such components) nano-particles surrounded by a thin dispersive material (e.g., some polymer) and diluted in one or several solvents. During post-processing (i.e., after printing) solvents and dispersants are removed, and a conductive path is formed across the metal particles by applying heat to the printed ink structure. This post-processing is usually called sintering, wherein usually oven sintering is used. Silver has been used most frequently because of its low resistivity and simple handling in post processing.

As mentioned above, copper is of specific interest as a material for conductive layers in electronics. However, commonly used silver inks cannot be simply replaced by copper nanoparticles inks without changing the post processing of the printed ink structure as non-conductive copper oxide may be generated during sintering thus deteriorating the desired electrical properties (low electric resistance) of the copper layer. Silver ink can be sintered in an oven. A copper ink may additionally need an inert or reductive atmosphere or an alternative approach to sintering. The same applies when nickel is used to form a thick metal layer.

In a non-inert and non-reductive atmosphere, copper ink has to be sintered in a very short time. For this reason the following two techniques have been used for sintering copper ink: pulsed light (e.g., high energy Xenon flash light) and laser sintering. In laser sintering, a laser beam scans the ink structure with either the laser beam or the platform carrying the substrate moving. Continuous-wave lasers as well as pulsed lasers have been successfully used to sinter silver or copper nanoparticle ink. The advantages of laser sintering over traditional oven sintering are the achievable speed of the sinter process and the possibility to sinter locally. However, for the use in the processing of silicon wafers the conductivity of the resulting copper layer is still too low (as compared with pure copper) which is suggestive of a comparably high portion of copper oxide within the layer. The exemplary embodiments described herein may at least alleviate this problem and contribute to reduce the amount of copper oxide in the resulting porous copper layer.

One exemplary method for processing a wafer to produce a copper layer is illustrated by the flow chart of FIG. 1. Accordingly, a printing process is used to produce copper layers having a thickness between 20 μm and 100 μm (or even more) instead of using a plasma deposition process (such as the mentioned plasmadust® process). In accordance with FIG. 1A, wafer is provided (step 101) comprising a thin (e.g., a few micrometers, less than 10 μm) metallic coating (e.g., nickel, tin, aluminum, silver, gold, titanium, tungsten, copper or alloys thereof) on which the porous copper layer can adhere. The coating may be structured to form the desired electrical connections. Then a copper particle ink or a copper particle paste is printed on the wafer, particularly on the adhesive coating previously deposited on the wafer (step 102). Generally, any printing process may be applicable. For example, screen printing may be used for producing copper layers having a thickness of up to 20 μm, whereas stencil printing may be used for producing even thicker copper layers having a thickness of up to 100 μm or more.

The printed copper structure is then dried (step 103) at an elevated temperature. For example, the drying process includes subjecting the wafer and the printed copper structure to a temperature of 60 degrees Celsius (° C.) for about 30 minutes while being in a nitrogen atmosphere. After this first drying step the wafers are ready to be (intermediately) stored before being further processed. Optionally, a subsequent second drying step may follow. This second drying step may include subjecting the printed copper structure to a temperature of about 100° C. for approximately 4 hours within a nitrogen atmosphere or a temperature of about 60° C. to 100° C. in a vacuum chamber for about 15 to 30 minutes.

The wafer including the dried copper structure is then subjected to a heat treatment. The heat treatment includes, as a first part, a sinter process (step 104), which may be carried out at elevated temperatures in an oven (oven sintering). The sintering process takes about 5 to 60 minutes at temperatures between 300° C. and 450° C. During this sintering process (already during the heating-up) the wafer is bathed in a carrier gas (e.g., nitrogen, helium, argon, xenon or forming gas) which is saturated (or at least almost saturated) with gaseous formic acid. In the present example, nitrogen is used as carrier gas for the formic acid. As an alternative to formic acid another substance with similar reducing properties may be used; such alternatives are, e.g., carbon monoxide (CO) and atomic hydrogen (obtained using a catalytic process or as plasma). To saturate the nitrogen with formic acid the nitrogen is directed, at room temperature, through a bubbler system which includes 98% formic acid. The saturated gas stream is then supplied to the sintering oven at flow rates between one and five liters per minute. A flow rate 2.6 liters per minute results in a delivery rate of about 200 mg of formic acid per minute to the sintering oven. As a result, a porous copper layer having a very low electrical resistivity of about 8-14 μΩ·cm, or even lower, is obtained. The pressure within the oven may be lower than the atmospheric pressure. A low-pressure may be improve the vaporization of volatile components of the particle paste.

During the sintering and annealing process one solid and coherent copper layer is formed from the copper particles in the printed copper paste. The sintering process is usually completed within a few minutes (e.g., 10 to 60 minutes). However, the heat treatment may be continued, i.e., an annealing process (step 105) may follow subsequent to the sintering process. During the annealing at temperatures between 300° C. and 450° C. (or even 500° C.) for approximately 20 to 180 minutes the smaller copper grains recrystallize to form larger grains with preferential grain orientation resulting in a stable sponge structure of a defined porosity (e.g., 50% porosity). The lower limit (300° C.) of the mentioned temperature interval may be chosen at least as high as the maximum temperature during operation of the resulting electronic device. Particularly, in power electronic devices the copper interconnects may experience transient peak temperatures of about 300° C. Generally, the annealing process is continued while the resistivity drops and until the desired low electrical resistivity is achieved. Moreover, the annealing process may be further continued until the copper layer has a stable microstructure. An unstable microstructure might be the cause for a further change in the copper layer microstructure during operation and thus lead to a faster degradation of the electronic device. By continuing the annealing until a stable microstructure is achieved in the copper layer, the mechanical stress and strain is reduced.

By the comparably long heat treatment (oven sintering and annealing within reducing atmosphere) of the copper layer, which has been printed on a semiconductor wafer (e.g., silicon, silicon carbide, gallium nitride), an improvement of the physical properties of the copper layer is achieved (such as a reduced specific electrical resistivity and a reduced mechanical stress) as compared with significantly shorter sintering processes such as, e.g., laser and flash-light treatment. During the heat treatment, a low electrical resistivity may be achieved in comparably short time, e.g., 10 to 20 minutes or even less. However, to obtain a stable microstructure of the copper layer the heat treatment is maintained for a longer time period, e.g., up to 180 minutes or more.

Before the above-mentioned sintering step (including the delivery of formic acid), a pre-sintering may precede. The pre-sintering may be accomplished in a sintering oven at temperatures of 100° C. to 300° C. in an atmosphere which may be reducing, inert or oxidizing. Additionally or alternatively, laser sintering at suitable laser-light wavelengths (in the red or infrared spectrum) or exposure to (e.g., xenon) flashlight may be used.

The FIGS. 2A to 2E include cross-sectional views of a semiconductor body (e.g., a semiconductor wafer or a semiconductor die) in different subsequent steps during the exemplary process described above with reference to FIG. 1. FIG.

Figure 2A:
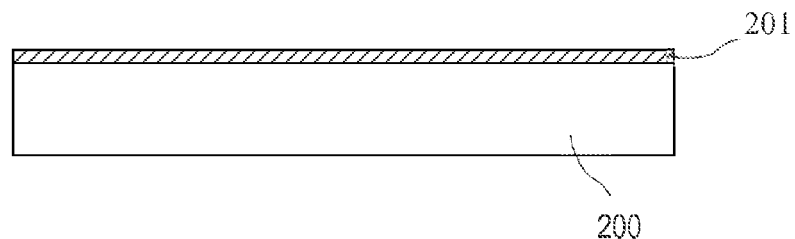
FIGS. 2A to 2E show a cross section through the semiconductor body according to an embodiment of the invention.
Figure 2B:
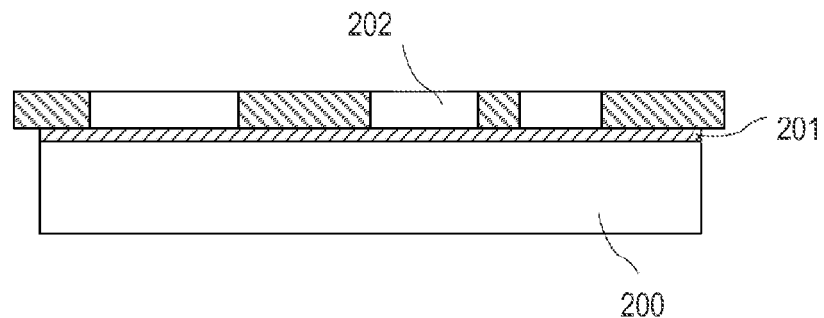

2A illustrates a semiconductor (e.g., silicon) wafer or a semiconductor die, generally referred to as semiconductor body 200. The semiconductor body 200 includes a thin (thickness lower than, e.g., 10 μm) metal coating 201 (e.g., nickel, tin, aluminum, silver, gold, titanium, tungsten, copper or alloys thereof) which is able to form an intermetallic compound with copper so that the porous copper layer can adhere thereto. Before applying the copper particle ink (copper paste), a stencil 202 is pressed onto the metallic coating 201 of the semiconductor 200 with a specific force F to provide a defined contact pressure between the stencil 202 and the semiconductor body 200. The stencil 200 may be structured in accordance with the desired copper pattern to be produced on the semiconductor body 200. This situation is illustrated in FIG. 2B. Instead of the stencil a screen may be used when a screen printing process is to be employed instead of stencil printing. As an alternative to the metal coating 201, a non-metallic (e.g., polyimide) coating may also be used when an electric isolation between the semiconductor body and the copper layer is desired.

Figure 2C:
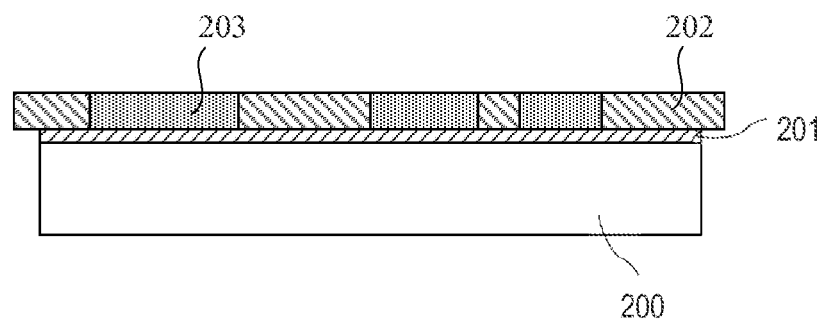

In the subsequent printing step (see FIG. 1, step 102), copper particle paste 203 is applied to the semiconductor body 200 thus producing a structured (or unstructured) copper layer which is patterned in accordance with the structure of the stencil 202 (or screen). This situation is illustrated in FIG. 2C. The stencil 202 may be made of stainless steel or nickel and patterned using known lasercut or electroforming methods. The thickness of the stencil may be between 30 μm and 300 μm, particularly between 50 μm and 100 μm. Usually, the copper paste is not applied as far as to the edge of the wafer, a space of 1 mm to 3 mm may be left blank at the margin of the wafer. The printing parameters, e.g., the used squeegee, the contact force between stencil 202 and semiconductor body 200, the lift-off velocity of the stencil 202 after applying the copper paste, etc., may depend on the actual printing process and the properties of the copper particle paste (e.g., its viscosity).

Figure 2D:
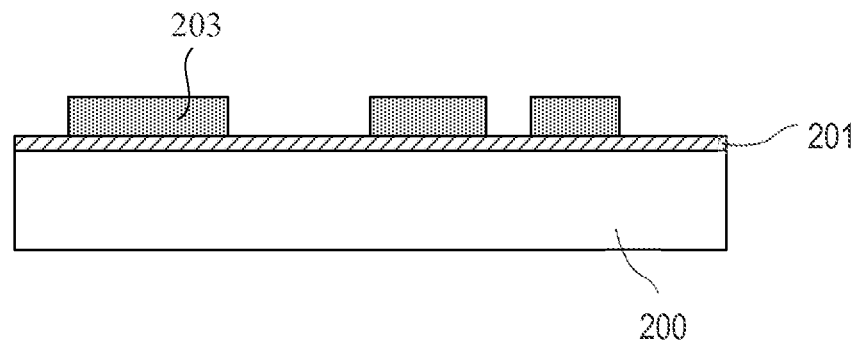

FIG. 2D illustrates the printed copper layer 203 on the semiconductor body 200 during the drying of the copper paste after the stencil 202 has been removed (see also FIG. 1, step 103). In the drying step, the temperature is increased (e.g., to about 60° C.) so that volatile components of the copper particle paste can volatilize, and the copper paste solidifies. To reduce or avoid oxidation of the copper paste, the drying is conducted in a nitrogen (i.e., non-oxidizing) atmosphere. Alternatively, the drying may be accomplished in an evacuated chamber. Moreover, the drying may include phases of different temperatures, e.g., 30 minutes at 60° C. and subsequently 240 minutes at 100° C. within nitrogen atmosphere, or, alternatively, 30 minutes at 60° C. within nitrogen atmosphere at 60° C. and subsequently 20 minutes at 80° C. in vacuum. However, the exact values may depend on the used copper paste and other parameters of the actual application.

Figure 2E:
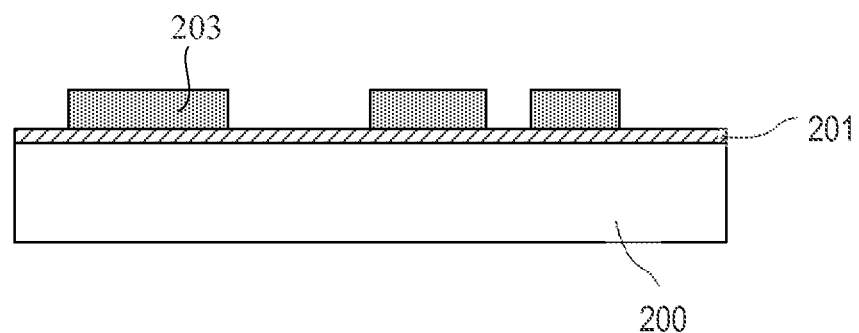
Figure 3A:
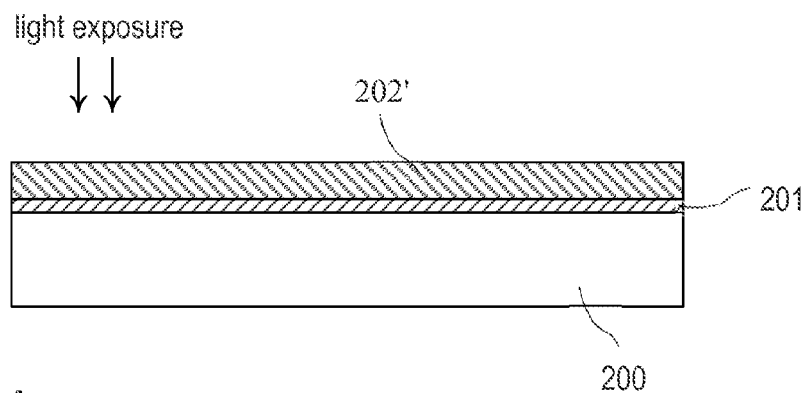
FIGS. 3A to 3D show a cross section through the semiconductor body according to another embodiment of the invention.
Figure 3B:
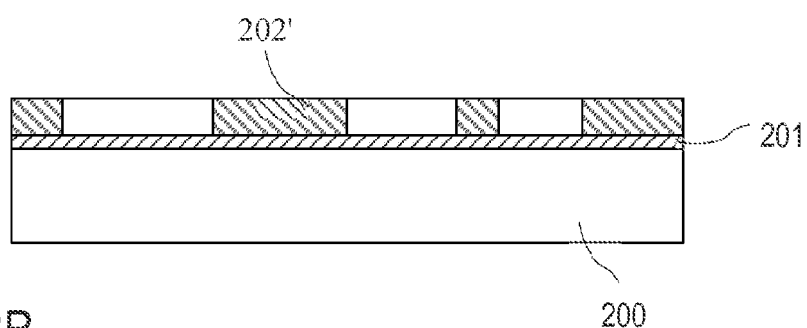
Figure 3C:
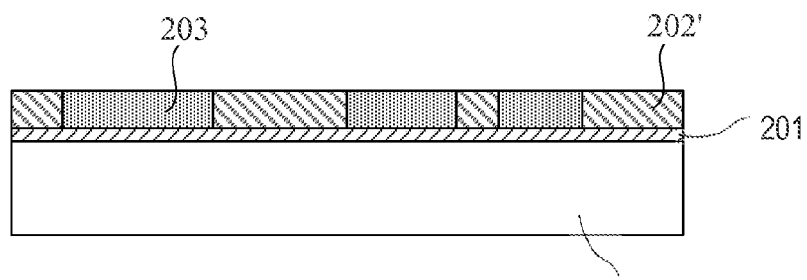
Figure 3D:
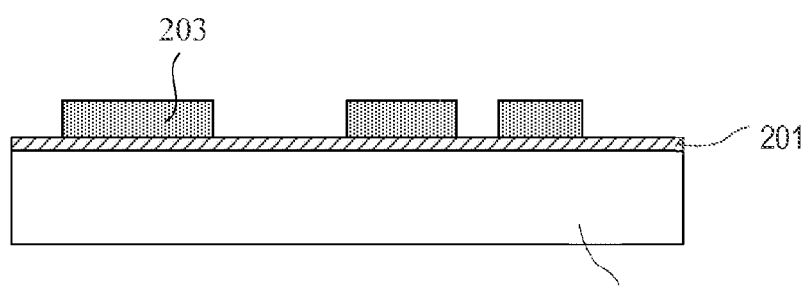

FIG. 2E illustrates the subsequent heat treatment including the sinter process and the subsequent annealing (see also FIG. 1, step 104), which may be carried out at elevated temperatures in an oven (oven sintering). The heat treatment (sintering and annealing process) may take approximately 5 to 60 minutes at temperatures between 300° C. and 450° C., in the present example 400° C. are applied. During the sintering process (already during the heating-up) the wafer is bathed in nitrogen an any other carrier gas which is (at least approximately) saturated with gaseous formic acid. To saturate the carrier gas with formic acid it may be directed through a bubbler system which includes formic acid at a specific concentration (e.g., 98%). The saturated carrier gas is then injected in the sinter oven at a specific flow rate. The flow rate may be between one and five liters per minute. A flow rate of 2.6 liters per minute results in a delivery rate of about 200 mg of formic acid per minute to the sintering oven.

As mentioned a pre-sintering may be optionally performed, e.g., within an inert or reductive gas atmosphere, wherein different sintering methods may be used in such pre-sintering step. Formic acid may be, but does not necessarily has to be applied during the pre-sintering. However, the subsequent (main) sintering process is accomplished as described above including the delivery of formic acid to the sintering oven.

FIG. 3 illustrates an alternative approach in which the stencil 202 is replaced by a photoresist layer 202'. FIG. 3A illustrates the semiconductor body 200 including a thin metal coating 201 like in the previous example. Additionally, the semiconductor body 200 includes a photoresist layer 202' which is suitable to be structured using any known photolithographic process. That is, the photoresist layer 202' is exposed to (patterned) light and subsequently to a development agent which removes the exposed potions of the photoresist layer. The remaining structured photoresist layer 202' may then be hardened by exposing it to elevated temperatures. The resulting structured photoresist layer 202' (see FIG. 3B) acts as a kind of stencil in the subsequent print process.

The copper particle paste 203 is applied to the semiconductor die 200 and the excess paste is removed (e.g., using a kind of squeegee). As a result the copper particle ink 203 only remains in the portions of the semiconductor body surface defined by the structured photoresist layer 202'. In the subsequent drying step the copper particle past is dried as in the previous example. After drying a pre-sintering step may follow before the photoresist layer 202' is removed. The pre-sintering may be an oven sintering process or a photonic process such as laser or flash-light treatment. Furthermore, the remaining photoresist layer 202' is removed. The sintering and annealing is accomplished in the same manner as described above with reference to the previous example.

The above described embodiments allow to use a metal particle paste to form thick (e.g., thickness of more than 10 μm, particularly more than 20 μm) metal layers on a semiconductor material. In contrast to known methods, which use short laser or flash-light pulses for sintering the metal particle paste, a comparably long heat treatment is conducted and continued until the printed metal layer assumes a stable (non-varying) and low electrical resistivity and a stable microstructure. Good results have been achieved with a heat treatment between 300° C. and 450° C. for about 20 to 180 minutes. Pre-sintering using any common sintering process may be performed (e.g., laser treatment). On a silicon wafer, however, a short laser treatment without any further heat treatment will result in insufficient electrical and mechanical properties. A reductive atmosphere is provided within the oven during the heat treatment. Good results have been achieved when using, e.g., nitrogen as carrier gas saturated with formic acid.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method comprising:
   providing a semiconductor wafer including a coating;
   printing a metal particle paste on the semiconductor wafer thereby forming a metal layer, wherein printing of the metal particle paste comprises:
      applying a photoresist layer on the semiconductor wafer;
      structuring the photoresist layer using a photolithographic process; and
      applying the metal particle paste to the structured photoresist layer; and
   heating the metal layer in a reductive gas for sintering the metal particle paste or for annealing a sintered metal particle paste in an oven.

2. The method of claim 1, wherein the reductive gas includes gaseous formic acid, atomic hydrogen or carbon monoxide.

3. The method of claim 1, wherein printing the metal particle paste comprises:
   pressing a stencil or a screen onto the semiconductor wafer;
   applying the metal particle paste to the stencil or the screen; and
   lifting-off the stencil or the screen.

4. The method of claim 1, further comprising before heating drying the metal particle paste.

5. The method of claim 4, wherein drying the metal particle paste is accomplished within an inert or reducing atmosphere or within a vacuum chamber.

6. The method of claim 4, wherein drying comprises applying a temperature between 60° C. and 200° C. for about 5 to 60 minutes.

7. The method of claim 1, wherein sintering is accomplished in a sintering oven and comprises delivering, as reductive gas, gaseous formic acid or carbon monoxide to the oven at a specific flow rate.

8. The method of claim 7, wherein delivering the gaseous formic acid comprises directing a carrier gas through liquid formic acid thus mixing the carrier gas with gaseous formic acid.

9. The method of claim 8, wherein delivering comprises delivering one to five liters of saturated nitrogen to the oven per minute.

10. The method of claim 1, wherein heating is conducted under a pressure which is lower than an ambient atmospheric pressure.

11. The method of claim 1, wherein heating comprises applying a temperature between 300° C. and 450° C. until an electrical resistivity of the metal layer assumes a substantially constant value.

12. The method of claim 11, wherein heating comprises annealing the metal layer at a temperature between 300° C. and 450° C. until a stable microstructure of the metal layer is achieved.

13. The method of claim 1, wherein the heating comprises applying a temperature between 300° C. and 450° C. for approximately 20 to 180 minutes.

14. The method of claim 1, wherein heating is preceded by pre-sintering of the metal particle paste with or without presence of a reducing gas.

15. The method of claim 1, further comprising:
   pre-sintering the metal particle paste before heating; and
   removing the structured photoresist layer after pre-sintering.

16. The method of claim 1, wherein the metal particle paste is a copper or a nickel particle paste.

17. The method of claim 1, wherein the metal layer has a thickness between approximately 10 μm and 150 μm or between approximately 20 μm and 150 μm.

18. A method comprising:
   providing a substrate;
   printing a metal particle paste on the substrate to form a metal layer, wherein printing of the metal particle paste comprises:
      applying a photoresist layer on the substrate;
      structuring the photoresist layer using a photolithographic process; and
      applying the metal particle paste to the structured photoresist layer; and
   heating in a reductive gas atmosphere for sintering the metal particle paste or for annealing a sintered metal particle paste in an oven.

19. The method of claim 18 wherein the substrate includes at least one of a semiconductor material, a glass, ceramic, or a metal.

* * * * *